(12) United States Patent
Haeussler et al.

(10) Patent No.: US 7,603,638 B2
(45) Date of Patent: Oct. 13, 2009

(54) METHOD AND SYSTEM FOR MODELING STATISTICAL LEAKAGE-CURRENT DISTRIBUTION

(75) Inventors: Robert Haeussler, Augsburg (DE); Harald Kinzelbach, Munich (DE)

(73) Assignee: Infineon Technologies AG, Munich (DE)

( * ) Notice: Subject to any disclaimer, the term of this patent is extended or adjusted under 35 U.S.C. 154(b) by 330 days.

(21) Appl. No.: 11/495,859

(22) Filed: Jul. 28, 2006

(65) Prior Publication Data
US 2008/0026489 A1    Jan. 31, 2008

(51) Int. Cl.
*G06F 17/50* (2006.01)
(52) U.S. Cl. .............................. 716/4; 716/1
(58) Field of Classification Search .............. 716/1, 716/4; 365/185; 438/14; 703/2
See application file for complete search history.

(56) References Cited

U.S. PATENT DOCUMENTS

| 6,184,048 | B1* | 2/2001 | Ramon ................... 438/14 |
| 6,574,760 | B1* | 6/2003 | Mydill ................... 714/724 |
| 7,239,163 | B1* | 7/2007 | Ralston-Good et al. ..... 324/763 |
| 2005/0043908 | A1* | 2/2005 | Bhavnagarwala et al. ..... 702/64 |
| 2007/0156367 | A1* | 7/2007 | Kucukcakar et al. ........ 702/123 |

* cited by examiner

*Primary Examiner*—Sun J Lin
(74) *Attorney, Agent, or Firm*—Brinks Hofer Gilson & Lione

(57) ABSTRACT

Disclosed is a method and system for modeling statistical leakage current distribution using logarithmic skew-normal distribution by generating statistical data with a statistical analysis method based on Monte-Carlo simulations or based on a pre-characterization response modeling step for a plurality of representative chip-unit models, deriving a plurality of parameters from said statistical data based on a specific class of statistical distributions, scaling said parameters to values used on realistic chip level, and generating leakage-current variation estimates based on said parameters.

17 Claims, 5 Drawing Sheets

United States Patent (US 7,603,638 B2)

METHOD AND SYSTEM FOR MODELING STATISTICAL LEAKAGE-CURRENT DISTRIBUTION

BACKGROUND

The invention generally relates to the field of semiconductor devices, and more specifically to statistical modeling of leakage-current under influence of process variations.

In semiconductor devices, leakage is a quantum phenomenon where mobile charge carriers (electrons or holes) tunnel through an insulating region. Leakage-currents increase exponentially as the thickness of the insulating region decreases. Tunneling leakage-current can also occur across semiconductor junctions between heavily doped P-type and N-type semiconductors. Other than tunneling via the gate insulator or junctions, carriers can also leak between source and drain terminals of a Metal Oxide Semiconductor (MOS) transistor. The primary source of leakage-current occurs inside transistors, but electrons can also leak between interconnects. Leakage-current increases power consumption and if sufficiently large can cause complete circuit failure.

In modern semiconductor technologies leakage-currents are quantities that may vary significantly from die to die due to increasing influence of uncontrollable random process variations. Also, the prediction of reliable margins for the leakage currents that might be expected is a crucial task for all applications with mandatory low power-consumption, e.g. mobile phones.

The usual worst/best-case corner estimates, which are traditionally used to assess the variation range of the leakage currents to be expected for a given design, are of little or no use, because they span a very pessimistic and completely unrealistic prediction range. Log-normal (LN) distributions have been used to predict the leakage-current variations, although the data used to determine the necessary parameters are not based on realistic design data and do not cover the full range of applied voltages and temperatures. Also, it is not uncommon to have a difference of more than one order of magnitude between worst- and best-case corner estimate values, which is far from the realistic distribution width determined e.g. by extensive simulations or by detailed leakage measurements.

Such worst/best-case corner estimate values are of little practical use when the "true" variation behavior is needed and it is, for example, of limited help for the designer of a low power mobile device to know that the achievable battery powered standby time is between one and ten days. Therefore, in order to decide whether a design idea is acceptable or not, the designer needs much more accurate and reliable information on the "true" variation range.

BRIEF SUMMARY

It is an advantage of the present invention to provide a method of modeling the statistical leakage-current distribution more accurately and without the disadvantages mentioned above. This is attained by a method of modeling statistical leakage current variations of different realizations of semiconductor chips, comprising the steps of generating the statistical data for a plurality of representative chip-unit-models, generating from that the corresponding data representative for the properties on chip level, and deriving a plurality of distribution parameters from said statistical data based on a specific class of skew-normal distributions or generalized extreme value distributions, and generating leakage-current variation estimates based on said distribution parameters.

In addition, a signal processing apparatus is provided for modeling statistical leakage-current variations by deriving a plurality of distribution parameters from statistical data that is generated with a statistical calculation for a plurality of representative chip-unit models based on a specific class of skew-normal and/or logarithmic skew-normal distributions, or generalized extreme value distributions, generating from said plurality of parameters the values relevant on realistic chip level and generating leakage-current variation estimates based on said distribution parameters.

Further characteristics of the invention and advantages thereof will be evident from the following detailed description of the preferred embodiment of the invention and the accompanying Figures, which are given by way of illustration only, and thus are not limited to the present invention.

DETAILED DESCRIPTION

Figure 1:
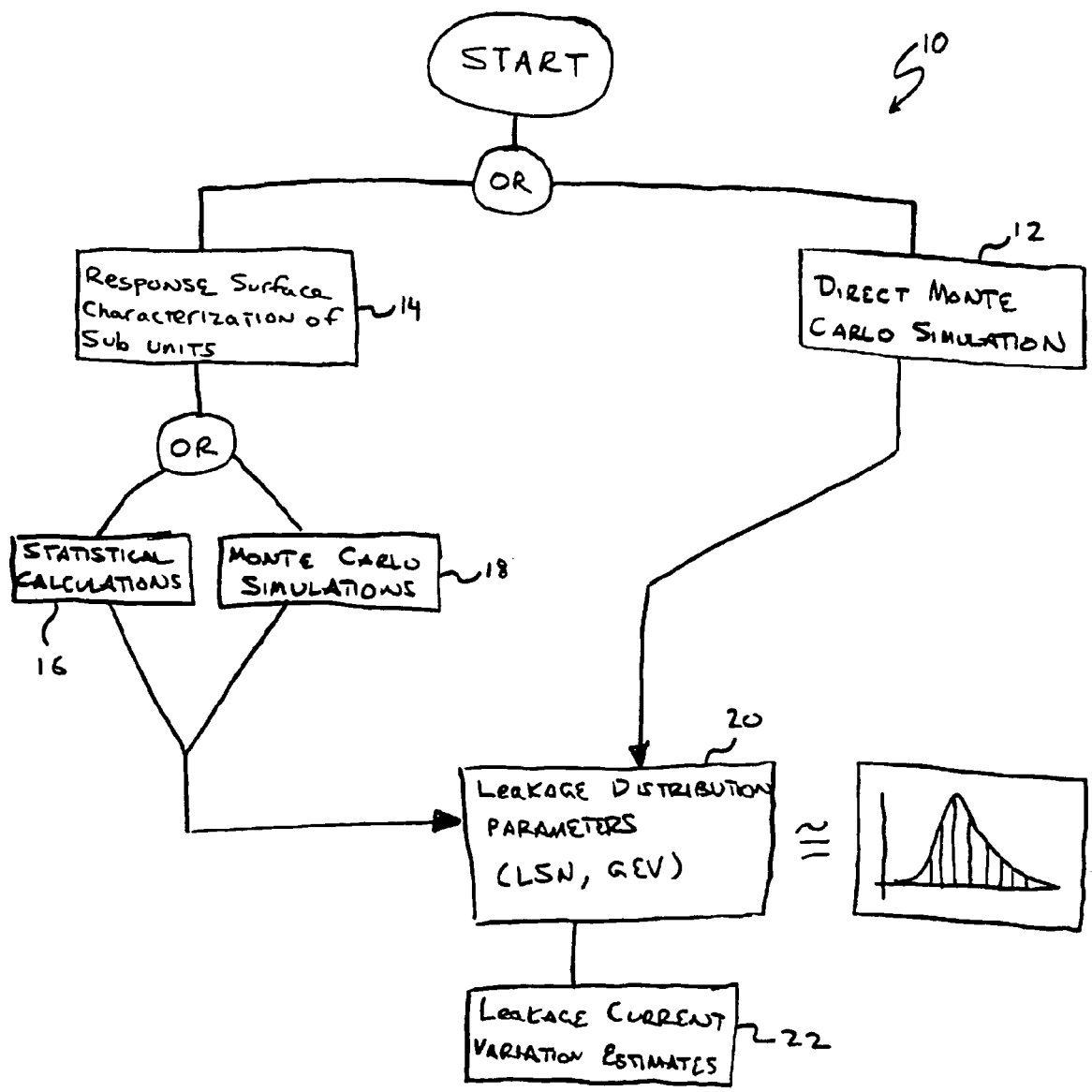
FIG. 1 illustrates a flow-chart of the method of the present invention.

It is to be noted that although the present invention is described with reference to the embodiments as illustrated in the following detailed description and in the accompanying drawings, the detailed description, as well as the drawings, are not intended to limit the present invention to the particular embodiments disclosed therein, but rather, the described embodiments merely exemplify the various aspects of the present invention, the scope of which is defined by the appended claims.

An important feature of the proposed method is that the statistical data needed to determine the parameters of the leakage-current distribution are derived from a statistical analysis of the circuit or of its appropriately defined subunits. In an embodiment of the invention, this statistical analysis consists of a direct analog Monte-Carlo simulation of the leakage current and a subsequent modeling step where the parameters of the leakage-current distribution are determined from this data by statistical parameter estimation methods like "maximum likelihood estimator" or "moment matching", or "direct distribution matching". Monte Carlo simulations are numerical methods that can be loosely described as statistical simulation methods, where statistical simulation is defined in quite general terms to be any method that utilizes sequences of random numbers to perform the simulation.

In another embodiment of the invention, this statistical analysis consists of a two-step process which starts from a pre-characterization step of the circuit or its sub-units by a response-modeling approach. In this case, first, the dependence of the leakage of the unit on the base-parameters is determined by a set of analog simulations where these base parameters are varied systematically, and the corresponding leakage is determined. From this data, response-models are generated based on an appropriate assumption on the underlying mathematical function to be used to model the behavior adequately. In its simplest form, one uses a higher dimensional polynomial fit to model the system behavior. If one starts from a response modeling based on sub-units, the response model of the whole circuit is derived subsequently from these sub-unit models.

In a second step, the response-model of the circuit is used to determine the parameters of the leakage-current distribution. This, again, can be done by a Monte-Carlo simulation, now based on the response-model as primary input, and a subsequent "maximum likelihood estimator", 'moment matching", or "direct distribution matching" step as in the first embodiment described above. It, however, can also be achieved by calculating the required parameters of the leakage-current distribution directly from the response model, using appropriate approximations. One example for the latter approach is to directly calculate the first few moments of the leakage-current distribution from the response-model and use this information as input to determine the parameters of the leakage-current distribution.

The data are used to generate the parameters of a corresponding statistical model, which is based on a class of highly versatile statistical distributions that have not been used in that context, but are superior to all commonly known standard distributions.

In an embodiment of the present invention, said class of highly versatile statistical distributions comprises the so called "generalized extreme value distributions".

In another embodiment of the present invention, said class of highly versatile statistical distributions comprises the so called "logarithmic skew-normal distributions". The underlying statistical analysis data generated from the representative circuits or chip-unit-models can be fitted almost perfectly by the logarithmic skew-normal distribution, allowing a much more accurate estimate for leakage-current variations. Furthermore, said plurality of parameters derived from said statistical data comprise a shape factor, a location parameter and a scale parameter optimizing the skew-normal distribution function in order to estimate said leakage current variations. Moreover, "maximum likelihood estimator", "moment matching", or "direct fitting" methods are used to fit said shape factor, said location parameter and said scale parameter to said skew-normal distribution function.

In yet another embodiment of the present invention, a signal processing apparatus is adapted to model statistical leakage current variations by deriving a plurality of parameters from statistical data that are generated with a Monte-Carlo or response-modeling based statistical analysis for a plurality of representative chip-unit-models. Said plurality of parameters is scaled to values used on realistic chip level in order to generate leakage-current variation estimates based on a specific class of statistical distributions.

Moreover, in another embodiment of the invention, a computer program that is loadable into an internal memory of a signal processing apparatus comprises software code portions for performing the method of modeling statistical leakage-current variations as mentioned above, when said product is run on said signal processing apparatus.

FIG. 1 illustrates a flow-chart 10 of a preferred method of the present invention. Here, the statistical data needed to determine the parameters of the leakage-current distribution are derived either from direct Monte-Carlo analog simulations 12 on representative chip-unit models, or from a response-modeling based analysis representative chip-unit models 14 (which can be obtained using statistical calculations 16 or a Monte Carl simulation 18). The data are then used to derive the distribution parameters 20 of a corresponding statistical model, which is based on a class of very versatile statistical distributions, the so called logarithmic skew-normal distributions. Alternatively, the distribution parameters can be derived using the generalized extreme value distribution (GEV), which is a family of continuous probability distributions developed within extreme value theory to combine the Gumbel, Frechet and Weibull families also known as type I, I1 and I11 extreme value distributions. Its importance arises from the fact that it is the limit distribution of the maxima of a sequence of independent and identically distributed random variables. Because of this, the GEV is used as an approximation to model the maxima of long (finite) sequences of random variables. In step 22, the distribution parameters are then used on a realistic chip level providing improved leakage current variation estimates.

Figure 2:
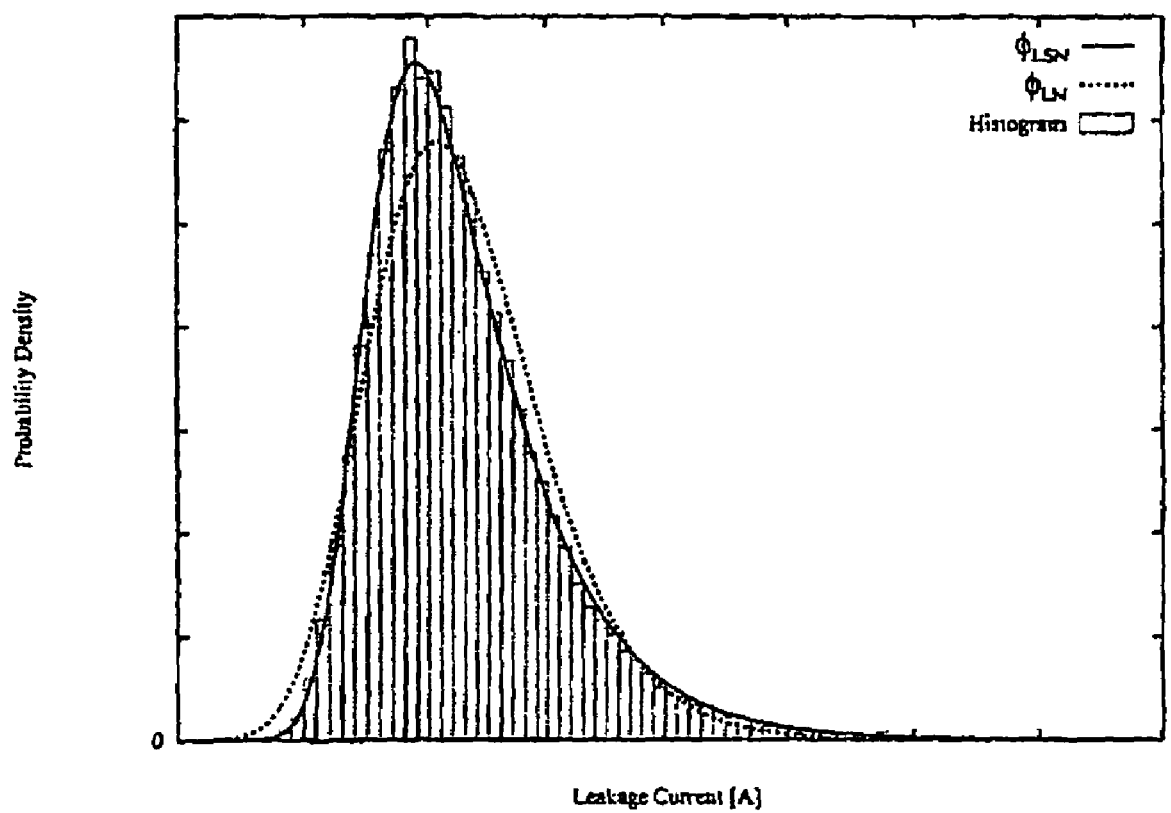
FIG. 2 illustrates an example of a histogram and fitted data for a small thirteen cell design in 90 nm technology at a temperature of 135° C. and a voltage of 1.2 V.
Figure 3:
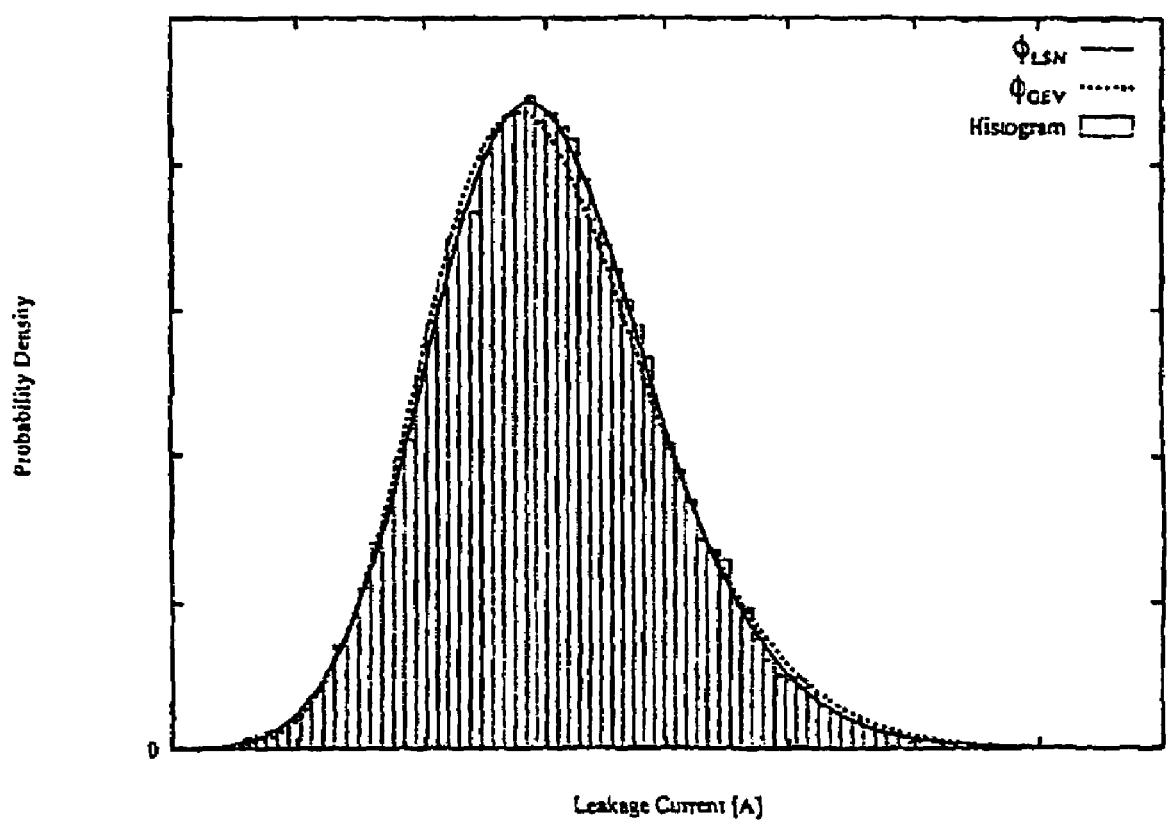
FIG. 3 illustrates an example of a histogram and fitted data for a small thirteen cell design in 90 nm technology at a temperature of −40° C. and a voltage of 1.2 V.
Figure 4:
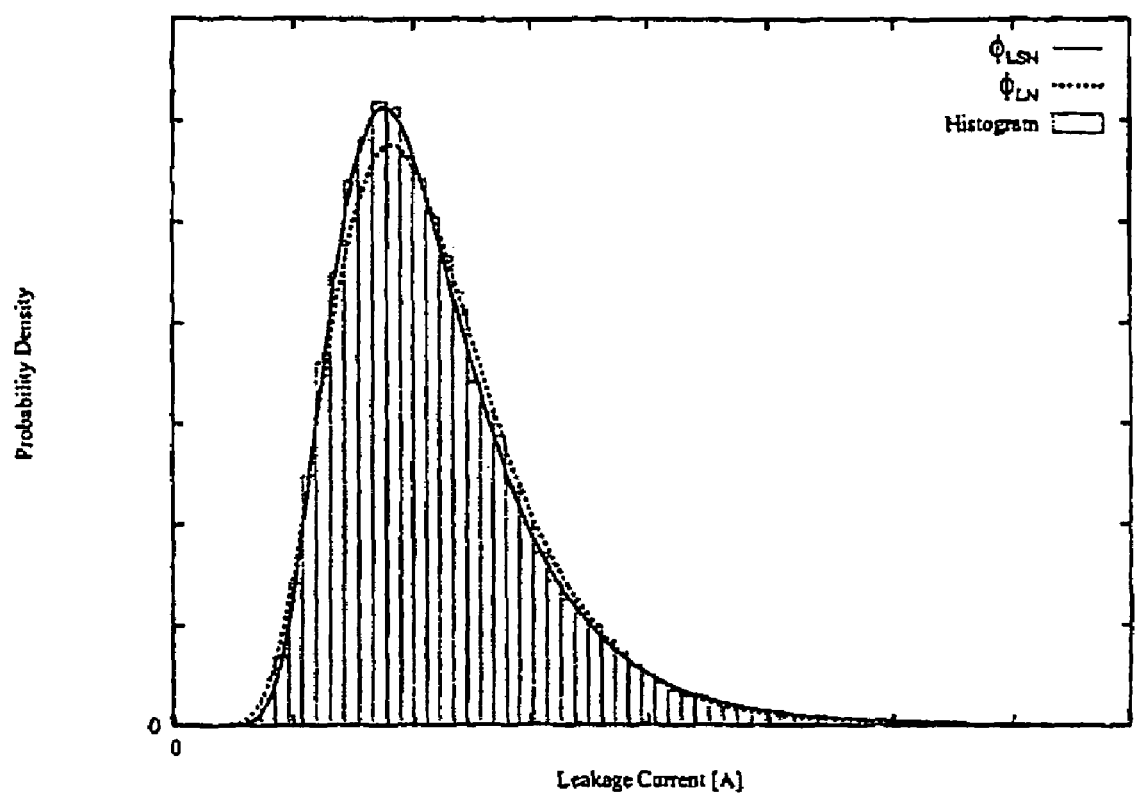
FIG. 4 illustrates an example of a histogram and fitted data for a 65 nm technology NOR3 cell at a temperature of 135° C. and a voltage of 1.0 V.

The simulation data shown in FIGS. 2, 3 and 4 represent a set of 50000 values that are derived from the analog Monte-Carlo simulations. The distributions are fitted using a maximum likelihood estimator MLE for the corresponding distributions. The circuits used in FIG. 2 and FIG. 3 are small 90 nm technology test-design-units comprising thirteen standard cells. The data shown in FIG. 4 is based on an average current of 65 nm NOR3 cells instantiated in all eight possible input configurations.

The examples shown in FIGS. 2, 3 and 4 illustrate that a logarithmic skew-normal distribution can be used to fit the underlying Monte-Carlo data with significantly improved accuracy. The data shown in FIGS. 2 and 4 clearly show that a fit based on a logarithmic normal distribution is not sufficient to model the given data with an appropriate accuracy. Both, the generalized extreme value distribution GEV as well as the logarithmic skew-normal distribution LSN fit the data sufficiently, whereas the GEV-fit is more or less indistinguishable from the LSN-fit on that scale. FIG. 3 illustrates the fact that there are parameter regimes where the LSN is superior, even compared to the GEV. Also, a simple logarithmic normal LN fit would be sufficient and is hardly distinguishable from the LSN at the scale used in FIG. 3. However, the LN-fit and the LSN-fit are basically superior to the GEV-fit.

The following example describes the steps necessary to fit the Monte-Carlo data by the "logarithmic skewnormal" distribution LSN. A so-called "skew-normal" (SN) distribution is defined by:

$$\Phi_{SN}(x;\alpha) = 2 \cdot \Phi_N(x) \cdot \Phi_N(\alpha;x), \quad (1)$$

where $\alpha$ is a so-called "shape" parameter, and $$\Phi_N(x) = \frac{1}{\sqrt{2\pi}} \cdot e^{\frac{1}{2}x^2} \text{ and } \Phi_N(\alpha x) = \int_{-\infty}^{\alpha x} \Phi(t) dt \quad (2)$$

denote the standard normal density function and the corresponding cumulated distribution function CDF. Let X be a random variable for the density function $\Phi_{SN}$, then, the location and scale parameters $\xi$, and $\omega$ are defined by the linear transform:

$$Y = \xi + \omega X \quad (3)$$

The skew-normal distribution function for Y is defined by:

$$\Phi_{SN}(x; \alpha; \xi; \omega) = \frac{2}{\omega} \Phi_N(z) \Phi_N(\alpha z) \text{ with } z \equiv \frac{x - \xi}{\omega} \quad (4)$$

A transformation to logarithmic variables by:

$$Z = e^Y, \quad (5)$$

which finally leads to the logarithmic version of SN distribution for Z:

$$\Phi_{LSN}(x;\alpha;\xi;\omega) = x^{-1}\Phi_{SN}[\ln(x);\alpha;\xi;\omega] \text{ for } x \in ]0,\infty]. \quad (6)$$

The relation between the cumulated distribution function (CDF) $\Phi_{SN}$ and $\Phi_{LSN}$ is even simpler:

$$\Phi_{LSN}(x;\alpha;\xi;\omega) = \Phi_{SN}[\ln(x);\alpha;\xi;\omega] \text{ for } x \in ]0,\infty]. \quad (7)$$

For the inverse CDF, sometimes called the "quantile function", it is:

$$\Phi_{LSN}^{-1}(p;\alpha;\xi;\omega) = \exp[\Phi_{SN}^{-1}(p;\alpha;\xi;\omega)] \text{ for } p \in ]0,1[. \quad (8)$$

The quantile function yields the leakage boundary value for a given probability p. In a random sample, it is found that with the given probability p leakage values are below this leakage boundary. This allows deriving a more adequate type of worst-case statements of the form "less than p percent of the chips produced will have a leakage current below the value $\Phi_{LSN}^{-1}(p; \alpha; \xi; \omega)$".

The distributions $\Phi_{SN}$ and $\Phi_{SN}^{-1}$ cannot be expressed by elementary functions, but there is, for example, an add-on package for the standard statistical language and a tool R, known from "R Development Core Team, R: A language and environment for statistical computing. R Foundation for Statistical Computing, Vienna, Austria, 2005".

This "SN-package" contains numerical implementations for $\Phi_{SN}$ and $\Phi_{SN}^{-1}$. Furthermore it also includes a maximum likelihood estimator MLE that is used to fit $\alpha$, $\xi$, and $\omega$ to statistical data. It should be noted that for $\alpha=0$ SN and LSN become normal and log-normal distributions, respectively, and that there is another more commonly used distribution that fits at least part of the data. It is known as the so-called generalized extreme value distribution GEV, which is defined by:

$$\Phi_{GEV}(x; \mu; \sigma; \xi) \equiv \frac{1}{\sigma}(1+\xi z)^{-1-1/\xi}e^{-(1+\xi z)^{-1/\xi}} \text{ with } z \equiv \frac{x-\mu}{\sigma} \quad (9)$$

As soon as the adequate distribution representing the data is available, it may also be used to derive more appropriate worst-case statements in order to estimate the expected leakage-currents for the set of chips to be produced. Based on the quantile function, statements of the form "less than p percent of the chips produced will have a leakage current below a value $j_{max}(p)$", where $j_{max}(p) = \Phi_{dist}^{-1}(p; \alpha; \xi; \omega)$.

Representative sets of statistical parameters can be determined using pre-selected categories of logical gate elements, wherein the compilation is achieved by a plurality of such logical gate elements.

Figure 5:
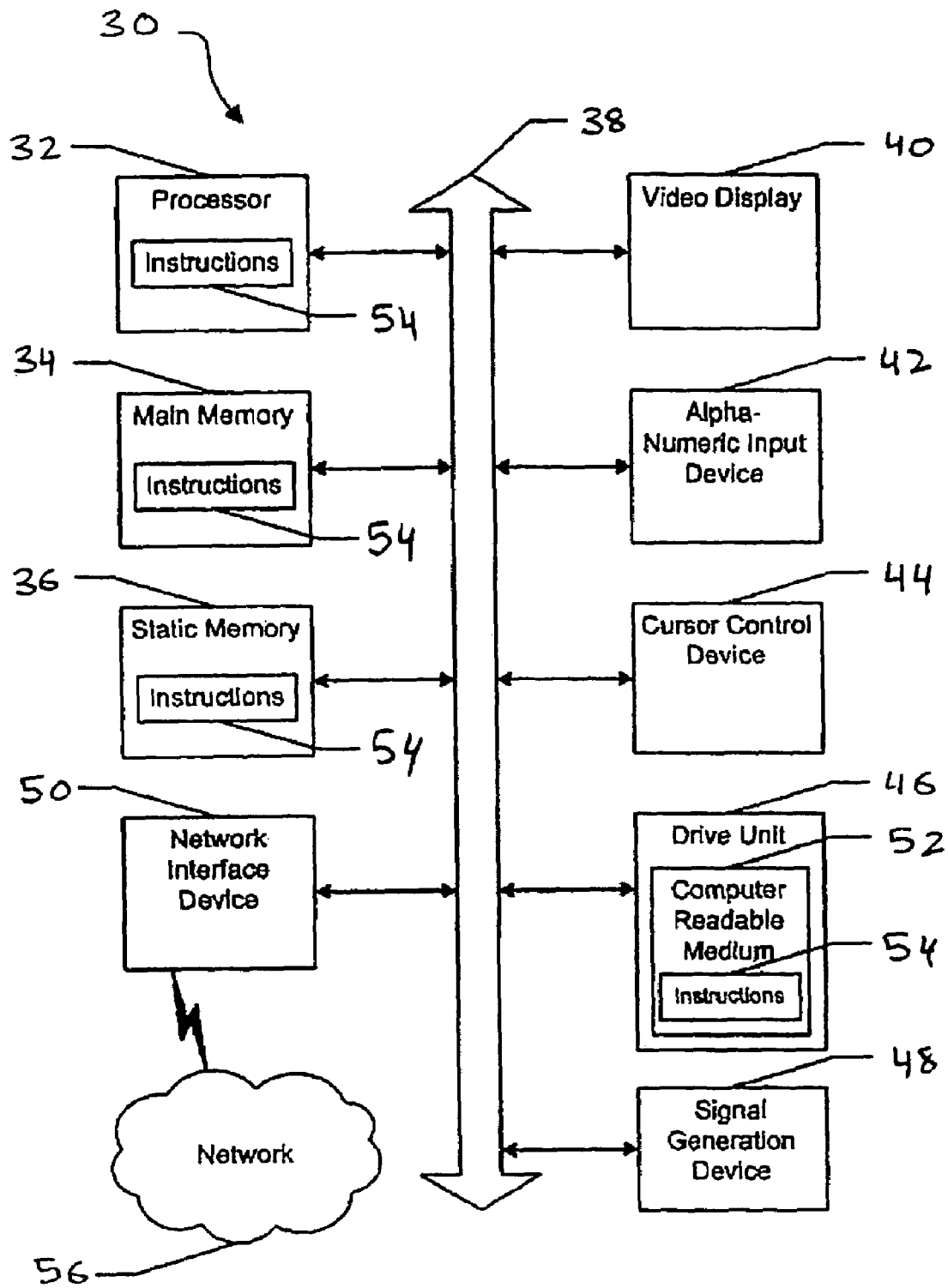
FIG. 5 illustrates an embodiment of a general computer system.

As Referring to FIG. 5, an illustrative embodiment of a general computer system is shown and is designated 30. The computer system 30 can include a set of instructions that can be executed to cause the computer system 30 to perform any one or more of the methods or computer based functions disclosed herein. The computer system 30 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 30 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 30 can be implemented using electronic devices that provide voice, video or data communication. Further, while a single computer system 30 is illustrated, the term "system" shall also be taken to include any collection of systems or sub-systems that individually or jointly execute a set, or multiple sets, of instructions to perform one or more computer functions.

As illustrated in FIG. 5, the computer system 30 may include a processor 32, e.g., a central processing unit (CPU), a graphics processing unit (GPU), or both. Moreover, the computer system 30 can include a main memory 34 and a static memory 36 that can communicate with each other via a bus 38. As shown, the computer system 30 may further include a video display unit 40, such as a liquid crystal display (LCD), an organic light emitting diode (OLED), a flat panel display, a solid state display, or a cathode ray tube (CRT). Additionally, the computer system 30 may include an input device 42, such as a keyboard, and a cursor control device 44, such as a mouse. The computer system 30 can also include a disk drive unit 46, a signal generation device 48, such as a speaker or remote control, and a network interface device 50.

In a particular embodiment, as depicted in FIG. 5, the disk drive unit 46 may include a computer-readable medium 52 in which one or more sets of instructions 54, e.g. software, can be embedded. Further, the instructions 54 may embody one or more of the methods or logic as described herein. In a particular embodiment, the instructions 54 may reside completely, or at least partially, within the main memory 34, the static memory 36, and/or within the processor 32 during execution by the computer system 30. The main memory 34 and the processor 32 also may include computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 54 or receives and executes instructions 54 responsive to a propagated signal, so that a device connected to a network 56 can communicate voice, video or data over the network 56. Further, the instructions 54 may be transmitted or received over the network 56 via the network interface device 50.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A method of modeling statistical variations of a leakage-current of semiconductor chips, the method comprising the steps of:
generating statistical data with a statistical analysis method using an analysis tool based on Monte-Carlo simulations or based on a pre characterization response-modeling step for a plurality of representative chip-unit-models;
deriving a plurality of distribution parameters from said statistical data based on a specific class of skew-normal distribution;
deriving values for said distribution parameters representative for realistic chip level leakage-current variations; and
generating leakage-current variation estimates based on said distribution parameters.

2. The method of claim 1, wherein said statistical data is based on a specific class of logarithmic skew-normal distribution.

3. The method of claim 1, wherein said plurality of distribution parameters comprise a shape factor, a location parameter and a scale parameter.

4. The method of claim 3, wherein a maximum likelihood estimator approach is used to fit said shape factor, said location parameter and said scale parameter to said specific class of skew-normal distribution or a specific class of logarithmic skew-normal distribution.

5. The method of claim 3, wherein a moment matching approach is used to fit said shape factor, said location parameter and said scale parameter to said specific class of skew-normal distribution or a specific class of logarithmic skew-normal distribution.

6. The method of claim 3, wherein a direct distribution fitting approach is used to fit said shape factor, said location parameter and said scale parameter to said specific class of skew-normal distribution or a specific class of logarithmic skew-normal distribution.

7. A method of modeling statistical leakage-current variations of a semiconductor chip, the method comprising the steps of:

generating statistical data with a statistical analysis method using an analysis tool based on Monte-Carlo simulations or based on a precharacterization response-modeling step for a plurality of representative chip-unit-models;

deriving a plurality of distribution parameters from said statistical data based on a "generalized extreme value" distribution;

deriving values for said distribution parameters representative for realistic chip level leakage-current variations; and generating leakage-current variation estimates based on said distribution parameters.

8. The method of claim 7, wherein said plurality of distribution parameters comprise a shape factor, a location parameter and a scale parameter.

9. A signal processing apparatus for modeling statistical leakage-current variations of semiconductor chins by deriving a plurality of distribution parameters from statistical data that is generated with a statistical analysis method based on Monte-Carlo simulations or based on a pre-characterization response-modeling step for a plurality of representative chip-unit-models based on a specific class of skew-normal distribution and/or a specific class of logarithmic skew-normal distribution, deriving values for said plurality of distribution parameters representative for realistic chip level leakage-current variations and generating leakage-current variation estimates based on said distribution parameters.

10. The signal processing apparatus of claim 9, wherein said plurality of distribution parameters comprise a shape factor, a location parameter and a scale parameter.

11. The signal processing apparatus of claim 10, wherein a maximum likelihood estimator approach is used to fit said shape factor, said location parameter and said scale parameter to said specific class of skew-normal or said specific class of logarithmic skew-normal distribution.

12. The signal processing apparatus of claim 10, wherein a moment matching approach is used to fit said shape factor, said location parameter and said scale parameter to said specific class of skew-normal distribution or said specific class of logarithmic skew-normal distribution.

13. The signal processing apparatus of claim 10, wherein a direct distribution fitting approach is used to fit said shape factor, said location parameter and said scale parameter to said specific class of skew-normal distribution or said of specific class logarithmic skew-normal distribution.

14. A signal processing apparatus for modeling statistical leakage-current variations of semiconductor chins by deriving a plurality of distribution parameters from statistical data that is generated with a statistical analysis method based on Monte-Carlo simulations or based on a pre-characterization response-modeling step for a plurality of representative chip-unit-models based on a "generalized extreme value" distribution, deriving values for said plurality of distribution parameters representative for realistic chip level leakage-current variations and generating leakage current variation estimates based on said distribution parameters.

15. The signal processing apparatus of claim 14, wherein said plurality of distribution parameters comprise a shape factor, a location parameter and a scale parameter.

16. A computer program product loadable into an internal memory of a signal processing apparatus, comprising software code portions for performing a method of modeling statistical leakage-current variations of semiconductor chips when said computer program product is run on said signal processing apparatus, the method comprising the steps of:

generating statistical data with a statistical analysis method based on Monte-Carlo simulations or based on a pre characterization response-modeling step for a plurality of representative chip-unit-models;

deriving a plurality of distribution parameters from said statistical data based on a specific class of skew-normal distribution;

deriving values for said distribution parameters representative for realistic chip level leakage-current variations; and generating leakage-current variation estimates based on said distribution parameters.

17. A computer program product loadable into an internal memory of a signal processing apparatus, comprising software code portions for performing a method of modeling statistical leakage-current variations of semiconductor chips when said computer program product is run on said signal processing apparatus, the method comprising the steps of:

generating statistical data with a statistical analysis method based on Monte-Carlo simulations or based on a pre characterization response-modeling step for a plurality of representative chip-unit-models;

deriving a plurality of distribution parameters from said statistical data based on a specific class of skew-normal distribution;

deriving values for said distribution parameters representative for realistic chip level leakage-current variations;

generating leakage-current variation estimates based on said distribution parameters;

wherein said plurality of distribution parameters comprise a shape factor, a location parameter and a scale parameter; and wherein a moment matching approach is used to fit said shape factor, said location parameter and said scale parameter to said specific class of skew-normal distribution or a specific class of logarithmic skew-normal distribution.

* * * * *